United States Patent
Mei et al.

(10) Patent No.: US 10,581,399 B2
(45) Date of Patent: Mar. 3, 2020

(54) IMPEDANCE MATCHING COMPONENT

(71) Applicants: Chong Mei, Jamesville, NY (US); Omar Eldaiki, East Syracuse, NY (US); Hans Peter Ostergaard, Viborg (DK)

(72) Inventors: Chong Mei, Jamesville, NY (US); Omar Eldaiki, East Syracuse, NY (US); Hans Peter Ostergaard, Viborg (DK)

(73) Assignee: Anaren, Inc., East Syracuse, NY (US)

( * ) Notice: Subject to any disclaimer, the term of this patent is extended or adjusted under 35 U.S.C. 154(b) by 32 days.

(21) Appl. No.: 15/220,940

(22) Filed: Jul. 27, 2016

(65) Prior Publication Data
US 2017/0310297 A1 Oct. 26, 2017

Related U.S. Application Data

(60) Provisional application No. 62/327,839, filed on Apr. 26, 2016.

(51) Int. Cl.
*H03H 7/38* (2006.01)
*H05K 1/11* (2006.01)

(52) U.S. Cl.
CPC ............... *H03H 7/38* (2013.01); *H05K 1/11* (2013.01)

(58) Field of Classification Search
CPC ................................. H03H 7/38; H05K 1/11
(Continued)

(56) References Cited

U.S. PATENT DOCUMENTS 5,563,551 A * 10/1996 Kashiwa ................ H03F 1/565
330/277
6,483,415 B1 * 11/2002 Tang ..................... H01F 17/0013
333/26

(Continued)

*Primary Examiner* — Stephen E. Jones
*Assistant Examiner* — Samuel S Outten
(74) *Attorney, Agent, or Firm* — Polsinelli PC

(57) ABSTRACT

The present invention is directed to an impedance matching network for use at a predetermined frequency. The network includes: a low impedance port having a first impedance substantially equal to an impedance of an RF amplifier port; a first distributive transmission line network coupled to the low impedance port, the first distributive transmission line network including a plurality of first transmission lines, each first transmission line being characterized by a first characteristic impedance and a first electric line length at the predetermined frequency to form a first quasi-lumped reactive element so that the plurality of first transmission lines form a first quasi-lumped element impedance matching stage; at least one second distributive transmission line network coupled to the first distributive transmission line network and a high impedance port, the second distributive transmission line network including a plurality of second transmission lines, each second transmission line being characterized by a second characteristic impedance and a second electric line length at the predetermined frequency to form a second quasi-lumped reactive element so that the plurality of second transmission lines form at least one second quasi-lumped element impedance matching stage; and a high impedance port coupled to the at least one second quasi-lumped element impedance matching stage, the high impedance port having a second impedance substantially equal to a system impedance.

21 Claims, 10 Drawing Sheets

(58) Field of Classification Search
USPC .......................................................... 333/33
See application file for complete search history.

(56) References Cited

U.S. PATENT DOCUMENTS

2015/0214919 A1\* 7/2015 Qureshi .................... H03H 7/42
  333/5
2017/0196639 A1\* 7/2017 Liao .......................... H03F 1/56

\* cited by examiner

IMPEDANCE MATCHING COMPONENT

CROSS-REFERENCE TO RELATED APPLICATIONS

This application claims priority to U.S. Provisional Patent Application Ser. No. 62/327,839 filed on Apr. 26, 2016, the content of which is relied upon and incorporated herein by reference in its entirety, and the benefit of priority under 35 U.S.C. § 119(e) is hereby claimed.

BACKGROUND OF THE INVENTION

1. Field of the Invention

The present invention relates generally to RF circuits, and particularly to impedance matching RF circuits.

2. Technical Background

An impedance matching network is employed to transform the resistive and reactive characteristics of a source impedance to the conjugate of a load impedance to thus ensure that the source delivers a maximum amount of power to the load. Complex conjugate matching is used when maximum power transfer is required, namely $Z_{LOAD}=Z^*_{SOURCE}$, where "*" is indicative of the complex conjugate. (In low-frequency or direct-current power transmission applications the reactance is typically negligible or zero). Impedance matching is therefore an important aspect in the design of microwave and RF circuits because they operate at relatively high frequencies. In power amplifier design, for example, the source matching network and the load matching network are the critical networks that must be configured to transform the system impedance to the desired impedance at the power amplifier transistor source. Using a specific example, a high power amplifier typically requires low impedance (e.g., a few Ohms) at the transistor (source) port; however, the power amplifier output must be impedance matched to the RF load (e.g., 50 or 75 Ohms). By way of an illustrative example, the optimum source impedance of a (100 Watt) LDMOS transistor (that has a 28V DC bias voltage), is typically within a 2-4 Ohm range with some capacitance. The load impedance on the other hand is typically 50 Ohm. In this case, the impedance transforming ratio can be quite high (e.g., 12.5 to 25).

In many applications, the impedance matching networks may be implemented in a variety of ways. For example, when the impedance transforming ratio is not large and/or the bandwidth is not wide, the impedance matching network can be implemented using a simple one-quarter wave transformer or a network that employs a few discrete components in one stage network. Examples of such networks include L-type network, a T-type network, or a Pi-type network. (An L-type network typically includes a first reactive component (e.g., an inductor or a capacitor) coupled between the source and the load, and a second reactive component (e.g., an inductor or a capacitor) shunted between the first reactive component output and ground. The T-network adds a third reactive component between the first reactive component and the load with the shunt reactance disposed between the first reactive component and the second reactive component. A Pi-network also includes three reactive components: the first reactive component is disposed between the source and the load and is coupled to a shunt reactance at either end thereof. While these simple "ladder" networks are suitable for relatively small impedance transformation ratios and relatively narrow bandwidths, something else is required when the impedance transformation ratio is larger and the bandwidth is relatively wider.

Referring to FIG. 1, a top view of a conventional matching network 1 for the output of a power amplifier is shown. The power amplifier includes a transistor 2 that has a source 2-1, a gate 2-2, and a drain 2-3. The source 2-1 is configured as a mounting strap 2-10 that can be affixed to a ground layer thereunder. The drain 2-3 is coupled to a conventional two-stage matching network 6 that includes a 50 Ohm output 6-1 coupled to a conductor 8 with is connected to the load. The 50 Ohm lead 6-1 includes a DC block 6-2. In this approach, the matching network 6 is configured as a multi-stage impedance transformation network suitable for a relatively large impedance transforming ratio and a relatively wide bandwidth. One of the drawbacks associated with a multi-stage network relates to degraded insertion loss performance. Another drawback relates to the size and complexity of a typical multi-stage transformation network. Here, the width of the matching network 6 is about 1.7 inches and, thus, this network requires a larger board space, which is a drawback in and of itself.

To be specific, there is a definite trend toward RF systems that provide wider bandwidth coverage, while at the same time, require a relatively small spatial footprint. What is needed, therefore, is an impedance matching solution that meets the aforementioned requirements (i.e., one that is characterized by a relatively wide bandwidth and a relatively small spatial footprint). Moreover, a device is needed that provides a large impedance transforming ratio and relatively low insertion loss (while simultaneously supporting a relatively wide bandwidth). What is further needed is an impedance matching device that is easy-to-use and configured as a compact surface mount component.

SUMMARY OF THE INVENTION

The present invention addresses the needs described above by providing an RF impedance matching solution that is characterized by a large impedance transforming ratio, relatively low insertion loss and a relatively wide bandwidth in an RF device that has a relatively small spatial footprint. Moreover, the present invention is easy-to-use and is configured as a compact surface mount component.

One aspect of the present invention is directed to an impedance matching device for use at a predetermined frequency, the device comprising: a low impedance port having a first impedance substantially equal to an impedance of an RF amplifier port; a first distributive transmission line network coupled to the low impedance port, the first distributive transmission line network including a plurality of first transmission lines, each first transmission line being characterized by a first characteristic impedance and a first electric line length at the predetermined frequency to form a first quasi-lumped reactive element so that the plurality of first transmission lines form a first quasi-lumped element impedance matching stage; at least one second distributive transmission line network coupled to the first distributive transmission line network and a high impedance port, the second distributive transmission line network including a plurality of second transmission lines, each second transmission line being characterized by a second characteristic impedance and a second electric line length at the predetermined frequency to form a second quasi-lumped reactive element so that the plurality of second transmission lines form at least one second quasi-lumped element impedance matching stage, wherein the high impedance port is coupled to the at least one second quasi-lumped element impedance matching stage, the high impedance port having a second impedance substantially equal to a system impedance.

In one embodiment, the first quasi-lumped element impedance matching stage is selected from a group of networks including a L-type network, a T-type network and a Pi-type network.

In one embodiment, the second quasi-lumped element impedance matching stage is selected from a group of networks including a L-type network, a T-type network and a Pi-type network.

In one embodiment, the first quasi-lumped reactive element is a transmission line that substantially approximates a capacitor or an inductor.

In one embodiment, the second quasi-lumped reactive element is a transmission line that substantially approximates a capacitor or an inductor.

In one embodiment, the plurality of first transmission lines and at least one of the plurality of second transmission lines form a coupler structure.

In one embodiment, the plurality of second transmission lines includes a fourth transmission line shunted from an output of the coupler structure to ground.

In one embodiment, the impedance matching device includes a first major surface and a second major surface.

In one version of the embodiment, the plurality of first transmission lines or the plurality of second transmission lines are formed by an outer metallization layer disposed on the second major surface, the outer metallization layer being configured to be coupled to a carrier metallization layer formed on a carrier printed circuit board, the outer metallization layer and the carrier metallization layer having substantially similar form factors.

In one version of the embodiment, the first major surface and the second major surface include metalized ground layers.

Another aspect of the present invention is directed to an RF system, the system comprising: an RF circuit device including a first major surface and a second major surface, the RF circuit device including, a low impedance port having a first impedance substantially equal to an impedance of an RF amplifier port, a first distributive transmission line network being coupled to the low impedance port, the first distributive transmission line network including a plurality of first transmission lines, each first transmission line being characterized by a first characteristic impedance and a first electric line length at the predetermined frequency to form a first quasi-lumped reactive element so that the plurality of first transmission lines form a first quasi-lumped element impedance matching stage, at least one second distributive transmission line network coupled to the first distributive transmission line network and a high impedance port, the second distributive transmission line network including a plurality of second transmission lines, each second transmission line being characterized by a second characteristic impedance and a second electric line length at the predetermined frequency to form a second quasi-lumped reactive element so that the plurality of second transmission lines form at least one second quasi-lumped element impedance matching stage, wherein the high impedance port is coupled to the at least one second quasi-lumped element impedance matching stage, the high impedance port having a second impedance substantially equal to a system impedance; and a printed carrier circuit board (PCB) including at least one RF circuit structure formed thereon, the RF circuit device being coupled to the at least one RF circuit structure.

In one embodiment, the plurality of first transmission lines or the plurality of second transmission lines are formed by an outer metallization layer disposed on the second major surface, the plurality of first transmission lines or the plurality of second transmission lines being configured in accordance with a predetermined shape, the predetermined shape having predetermined dimensions, the predetermined shape and the predetermined dimensions substantially corresponding to a coupling region formed on the printed circuit board.

In one version of the embodiment, the outer metallization layer is configured to be coupled to the coupling region formed on the printed circuit board.

In one version of the embodiment, the first major surface and the second major surface include metalized ground layers.

In one embodiment, the first quasi-lumped element impedance matching stage is selected from a group of networks including a L-type network, a T-type network and a Pi-type network.

In one embodiment, the second quasi-lumped element impedance matching stage is selected from a group of networks including a L-type network, a T-type network and a Pi-type network.

In one embodiment, the first quasi-lumped reactive element is a transmission line that substantially approximates a capacitor or an inductor.

In one embodiment, the second quasi-lumped reactive element is a transmission line that substantially approximates a capacitor or an inductor.

In one embodiment, the at least one of the plurality of first transmission lines and at least one of the plurality of second transmission lines form a coupler structure.

In one version of the embodiment, the plurality of second transmission lines includes a fourth transmission line shunted from an output of the coupler structure to ground Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figure 3:
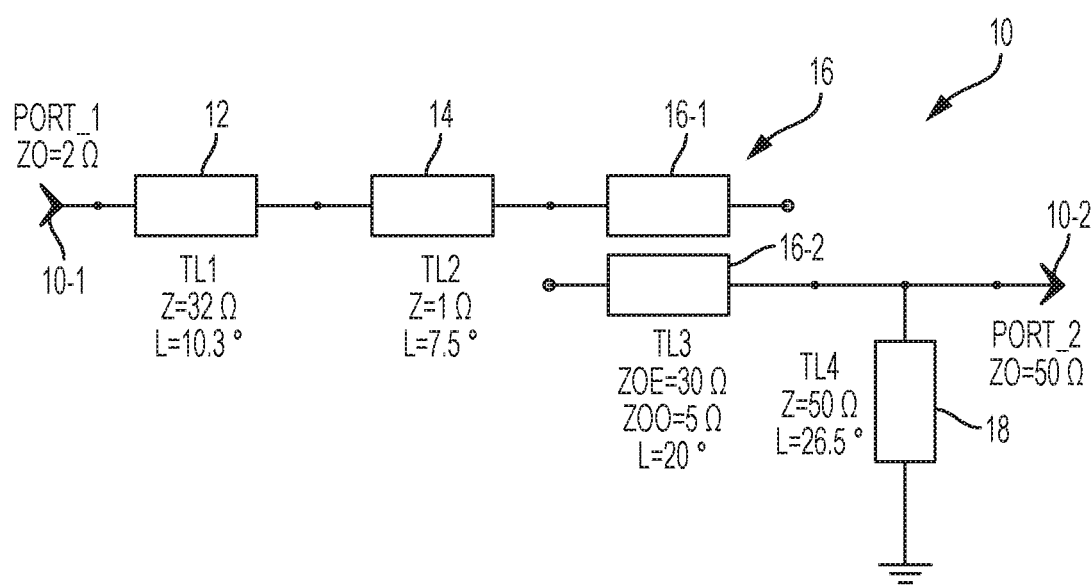
FIG. 3 is a schematic view of a distributive transmission line network approximating the network depicted in FIG. 2 in accordance with the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the device of the present invention is shown in FIG. 3, and is designated generally throughout by reference numeral 10.

Figure 1:
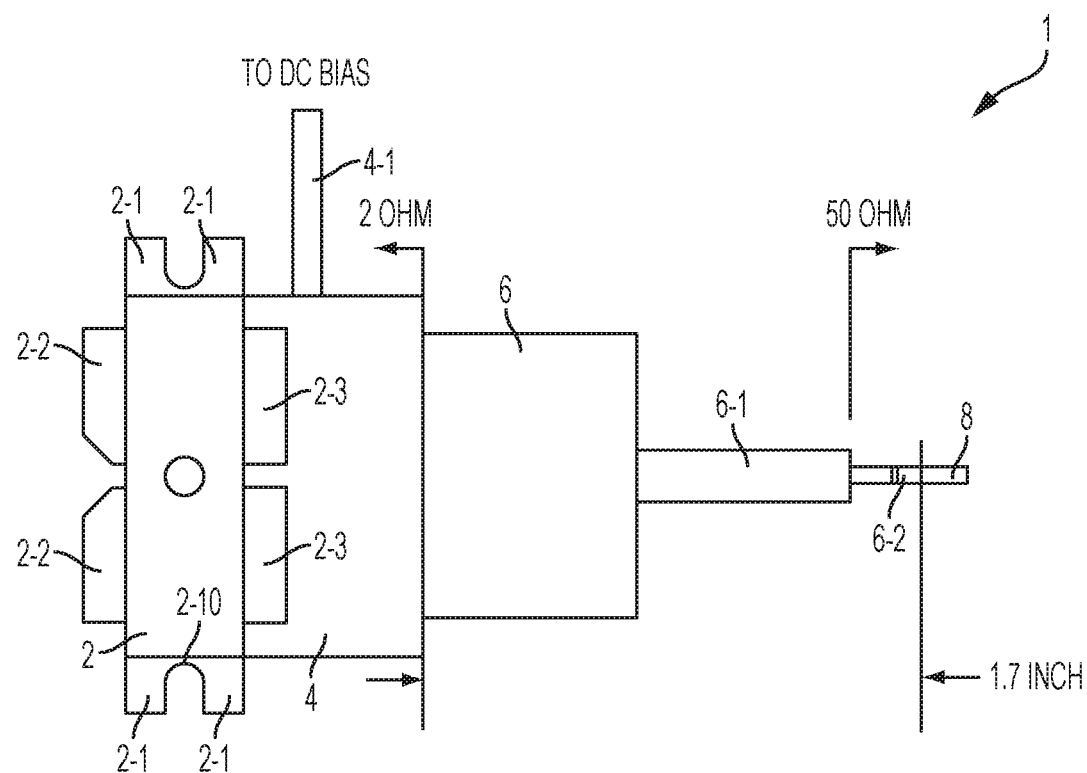
FIG. 1 is a top view of a conventional matching network for the output of a power amplifier.
Figure 2:
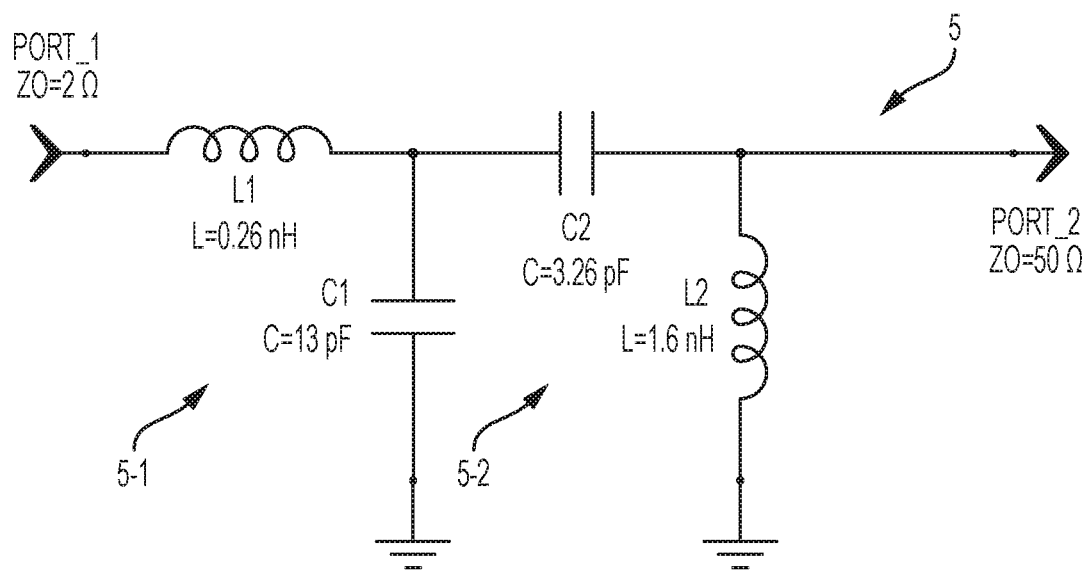
FIG. 2 is a schematic view of a two-stage lumped element network provided for illustrative purposes.

Referring to FIG. 2, a schematic view of a two-stage lumped element network 5 is provided for illustrative purposes. Specifically, the network 5 includes two L-type networks (5-1, 5-2). The L-type network 5-1 includes an inductor 5-1 coupled to the low impedance port 1 and a shunt capacitor C1. The inductor 5-1 is further coupled to capacitor C2, which is further coupled to the shunt inductor L2 and the high impedance (50 Ohm) port 2. The values of the equivalent capacitors and inductors are provided in FIG. 2. From a theoretical standpoint, the network 5 may work well, for example, in the system depicted in FIG. 1. However, if the system designers employ discrete capacitors (C1, C2) and discrete inductors (L1, L2) to form the matching network 5, several design challenges would have to be overcome.

As an initial point, the quality factor (or Q) of the inductors and capacitors has to be relatively high to achieve low insertion loss. (As those of ordinary skill in the art will appreciate, the quality factor (or Q) of a capacitor is the ratio of its reactance to its resistance at a given frequency, and is a measure of its efficiency. Similarly, the quality factor of an inductor is the ratio of its inductive reactance to its resistance at a given frequency, and is a measure of its efficiency). High Q off-the-shelf components are typically both very costly and relatively large. Another issue relates to the fact that thermal management of discrete components can be problematic in high power applications. Thus, the capacitors and inductors used to implement a discrete design must be of a very high grade (e.g., appropriate heat resistance and high voltage breakdown characteristics). Yet another issue relates to the fact that the tolerance of the discrete components and parasite effects on various PCB board makes it difficult to maintain any performance consistency.

In another approach, the designers could choose to print a two-stage microstrip quarter wavelength transformer to obtain the same bandwidth and impedance transforming ratio; but this approach would take a large amount of board space. Moreover, this design would require an additional DC block capacitor in the main RF path.

As embodied herein and depicted in FIG. 3, a schematic view of a distributive transmission line network 10 in accordance with the present invention is disclosed. The network 10 is configured to closely approximate the network 5 depicted in FIG. 2 while substantially eliminating the drawbacks described above. To be clear, the distributive transmission line network 10 is configured as a 2 Ohm to 50 Ohm impedance transformer in the frequency band of 2200-2600 MHz. Those skilled in the art will appreciate that the electrical lengths of the transmission lines shown herein are given in terms of a design frequency of 2450 MHz. Briefly stated, the distributive transmission line network 10 employs distributed transmission line elements (12, 14, 16 and 18) to realize a "quasi-lumped-element" matching network 10 using a multi-layer PCB technology.

The first port 10-1 accommodates 2 Ohm output impedance ZO and is coupled to a transmission line 12 having a characteristic impedance (Z) of about 32 Ohms and an electrical length (L) of about 10.3°. The transmission line 12 is configured to approximate the inductor L1 shown in FIG. 2. The transmission line 12 is coupled to transmission line 14, which is configured to approximate the capacitor C1 shown in FIG. 2. The transmission line 14 has a characteristic impedance (Z) of about 1 Ohm and an electrical length (L) of about 7.5°. The transmission line 14 is also coupled to a coupler structure 16 that is configured to provide DC isolation (making the DC isolation capacitor 6-2—shown in FIG. 1—redundant).

The coupler structure 16 includes tightly coupled transmission lines 16-1 and 16-2. The coupler structure 16 is characterized by an odd-mode impedance (ZOO) of about 5 Ohms and an even mode impedance (ZOE) of about 30 Ohms. The coupler structure 16 has an electrical length (L) of about 20°. One end of the transmission line 16-1 is connected to transmission line 14 while the opposite end is left open. One end of the transmission line 16-1 is left open while the opposite end of transmission line 16-2 is connected to the second port 10-2. The coupler structure 16 is configured to approximate the capacitor C2 depicted in FIG. 2.

Finally, a fourth transmission line 18 is shunted from the output of coupler structure 16 to ground. The fourth transmission line 18 has a characteristic impedance (Z) of about 50 Ohm and an electrical length (L) of about 26.5°. The fourth transmission line 18 is configured to approximate the inductor L2 depicted in FIG. 2.

Again, the distributive transmission line network 10 depicted in FIG. 3 uses distributed transmission line elements (12-18) to form quasi-lumped-elements to thus implement an impedance matching network using multi-layer PCB technology. As those skilled in the art will appreciate, the principles of the present invention may be employed to form any type of multi-stage matching network comprising quasi L-type, quasi T-type or quasi Pi-type networks.

Figure 4:
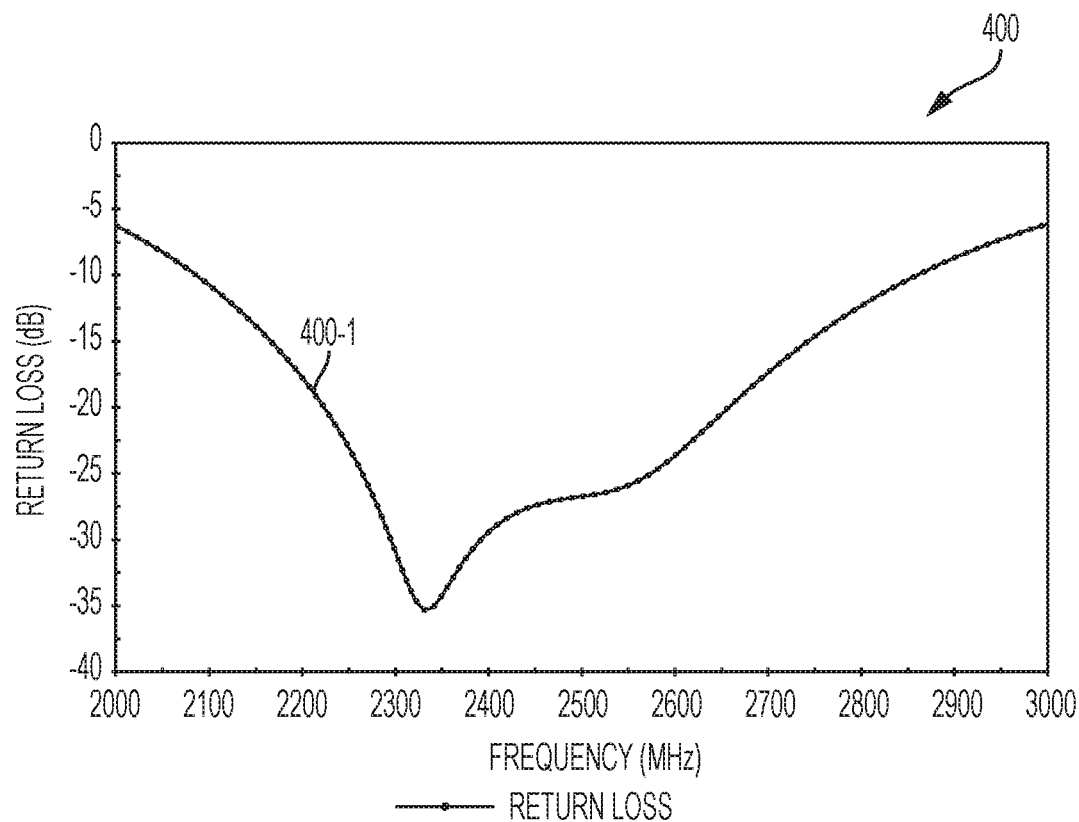
FIG. 4 is a plot illustrating a simulated return loss performance of the network depicted in FIG. 2.

Referring to FIG. 4, a chart 400 illustrating a simulated return loss performance 400-1 of the network 10 depicted in FIG. 3 is shown. Again, the electrical lengths of the transmission lines shown herein are given in terms of a frequency of 2450 MHz. Network 10 is configured as a 2 Ohm to 50 Ohm impedance transformer in the frequency band of 2200-2600 MHz. In the simulation shown in FIG. 4, the return loss is better than −20 dB. The schematic topology features DC isolation (coupler structure 16) between input and output, which is desired in power amplifier matching networks where DC block is needed along the RF path for DC bias purposes.

Figure 5A:
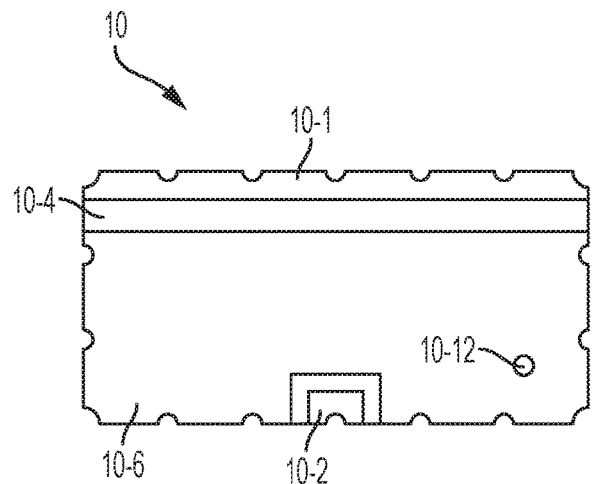
FIGS. 5A-C are top, bottom and isometric views of a surface mount RF component in accordance with the present invention.
Figure 5B:
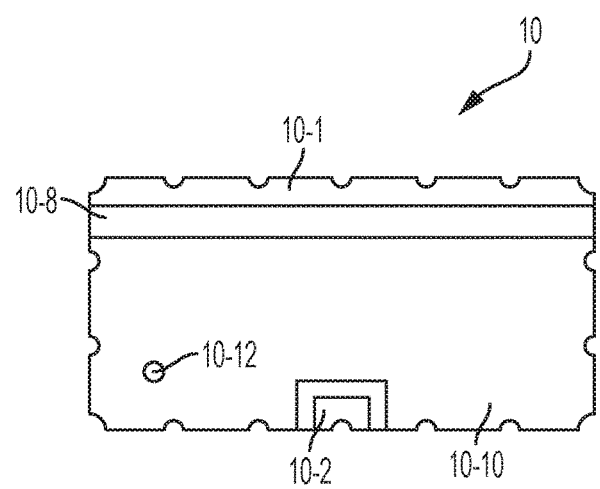
Figure 5C:
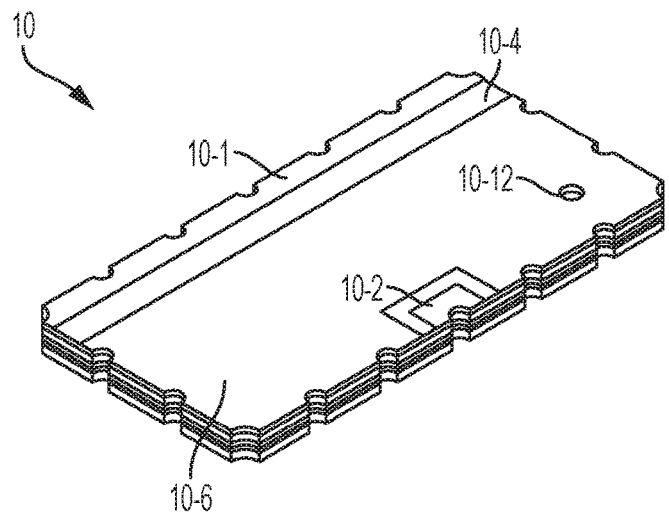

Referring to FIGS. 5A-C, top, bottom and isometric views of a surface mount RF component 10 in accordance with the present invention are shown. According to the teachings of the present invention, the distributive transmission line network 10 is implemented by a compact (0.3"×0.6") surfaced mount technology (SMT) component package. FIG. 5A is the top view, FIG. 5B is the bottom view and FIG. 5C is an isometric view of the SMT component. For example, the top surface (FIG. 5A) shows the metalized low impedance first port 10-1 separated from the metalized ground plane 10-6 by a dielectric strip 10-4. The second high impedance port 10-2 is also shown. The bottom view and isometric view show similar features.

Figure 6:
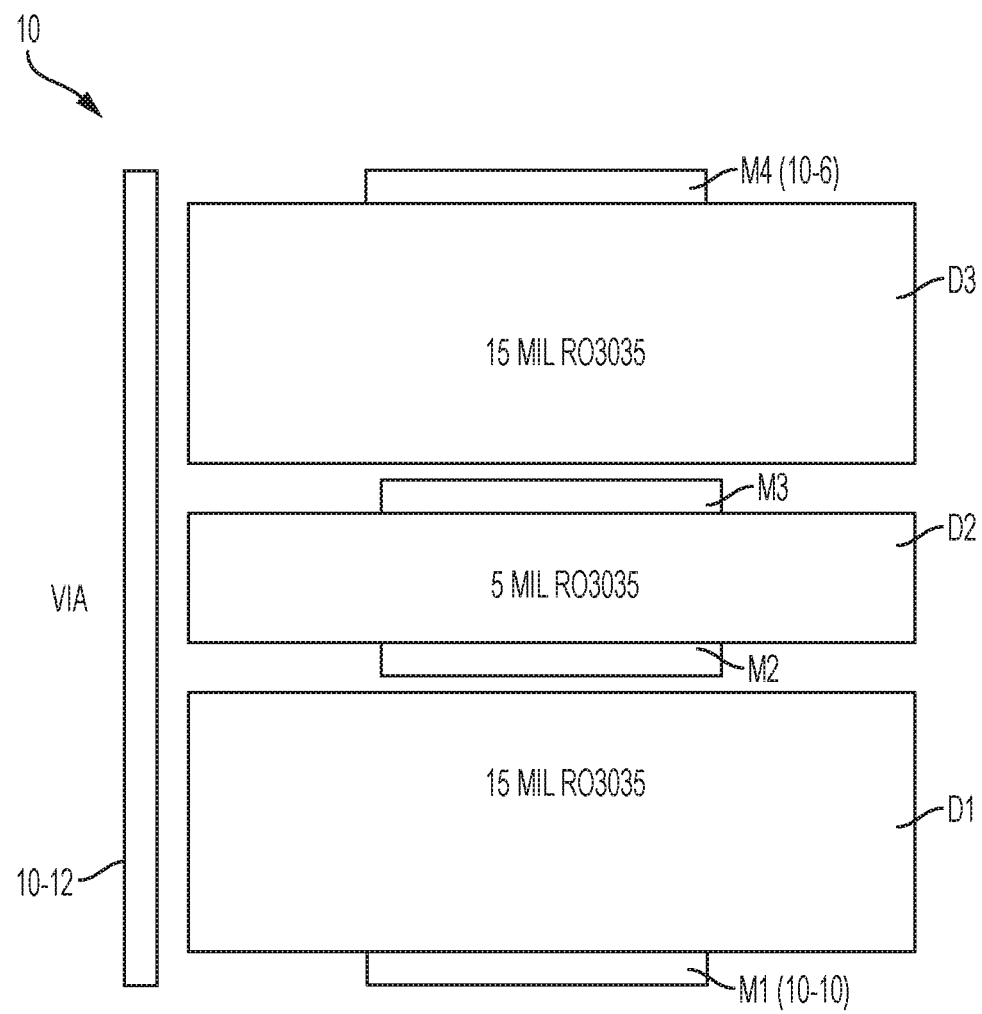
FIG. 6 is a diagrammatic depiction of a component stack-up for the distributive transmission line network shown in FIG. 3 and the component depicted in FIGS. 5A-5C in accordance with the present invention.

As embodied herein and depicted in FIG. 6, a diagrammatic depiction of a component stack-up for the distributive transmission line network 10 shown in FIG. 3 in accordance with the present invention is disclosed. The bottom ground plane 10-10 (shown in FIG. 5B) is provided by a metallization layer M1 disposed on dielectric layer D1. A second dielectric layer D2 includes internal metallization layers M2 and M3 on either side thereof. A third dielectric layer D3 includes a metallization layer M4 disposed thereon to thus form the upper ground plane 10-6.

Those of ordinary skill in the art will appreciate that any suitable dielectric material may be employed to form the dielectric layers D1-D3 based on the required electrical, mechanical, dielectric constant and thermal conductivity requirements of the design. In one embodiment, the dielectric layers D1-D3 are formed using PTFE laminate circuit boards or ceramic filled PTFE composite laminate circuit boards suitable for high frequency applications. For example, the dielectric layers D1-D3 may be formed using RO3035 laminated boards. In one embodiment layers D1 and D3 are about 15 mils thick whereas layer D2 is about 5 mils thick.

Figures 7A, 7B, 7C:
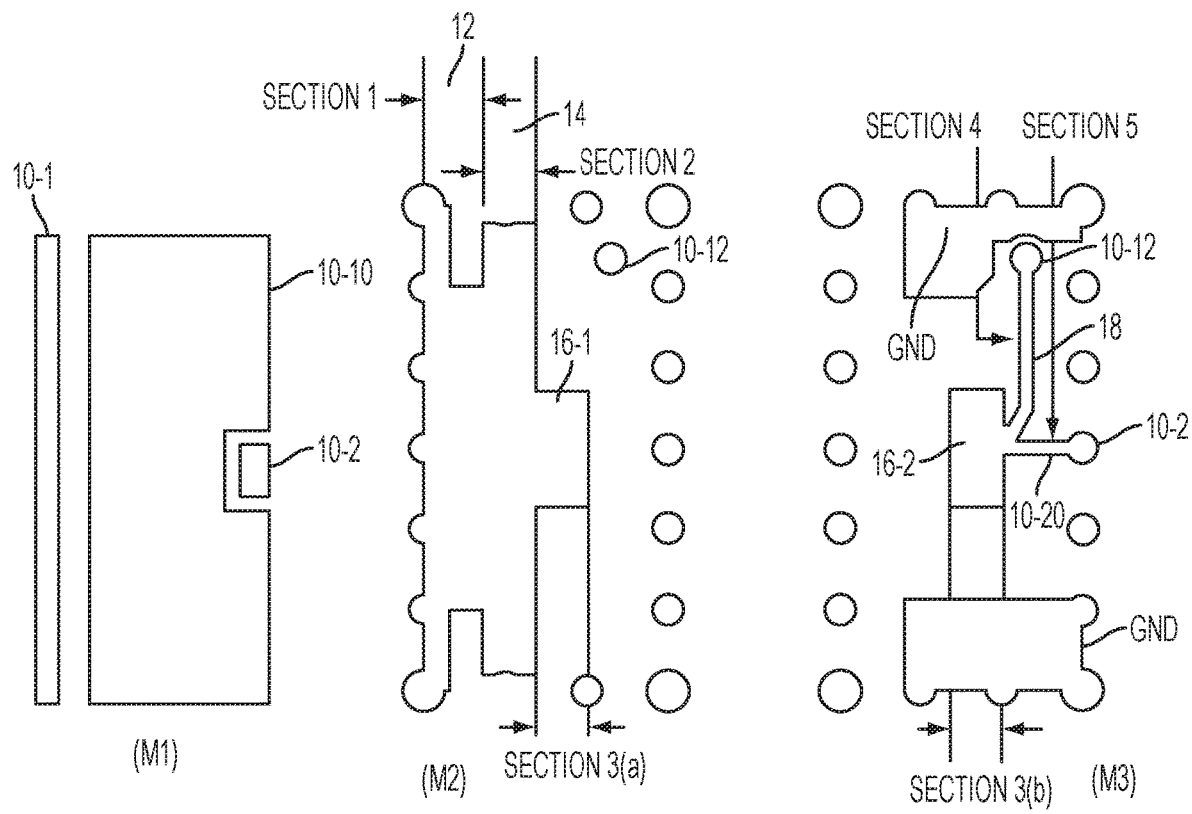
FIGS. 7A-7E are top views of each metallization layer for the component stack-up depicted in FIG. 6.

In reference to FIGS. 7A-7E, top views of each metallization layer for the component stack-up depicted in FIG. 6 are disclosed. FIG. 7A shows the metallization layer M1 that includes the low impedance (2 Ohm in this case) port 10-1, the high impedance port 10-2 and the ground layer 10-10.

FIG. 7B shows layer M2 which includes transmission line 12 (inductor L1), transmission line 14 (shunt capacitor C1) and transmission line 16-1. A portion of via 10-12 is also shown in this view. FIG. 7C includes transmission line 16-2 disposed between two ground plates (GND). As noted above, lines 16-1 and 16-2 are coupled transmission lines (that form capacitor C2). FIG. 7C also includes transmission line 18 (shunt inductor L2). Finally, transmission line 10-20 forms a 50 Ohm transmission line to couples the RF signal to the 50 Ohm port 10-2.

Figures 7D, 7E:
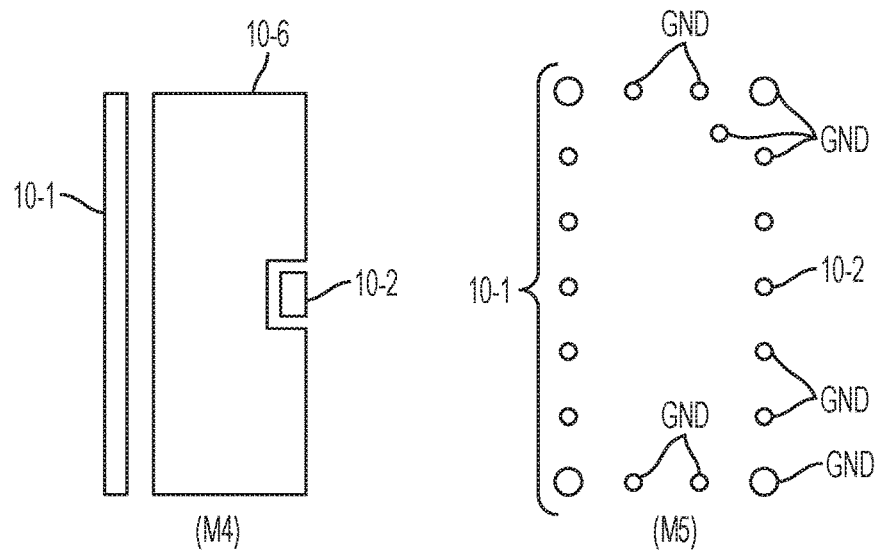

FIG. 7D shows the top metallization layer M4 which includes the low impedance (2 Ohm in this case) port 10-1, the high impedance port 10-2 and the ground layer 10-6. In FIG. 7E, a layer M5 is shown (not depicted in FIG. 6); this layer shows the via structures internally disposed in the device 10. As depicted in FIG. 7E, all vias in the left-hand column (in the orientation shown), are tied to 10-1. All of the remaining vias, except 10-2, are ground vias.

Figure 8:
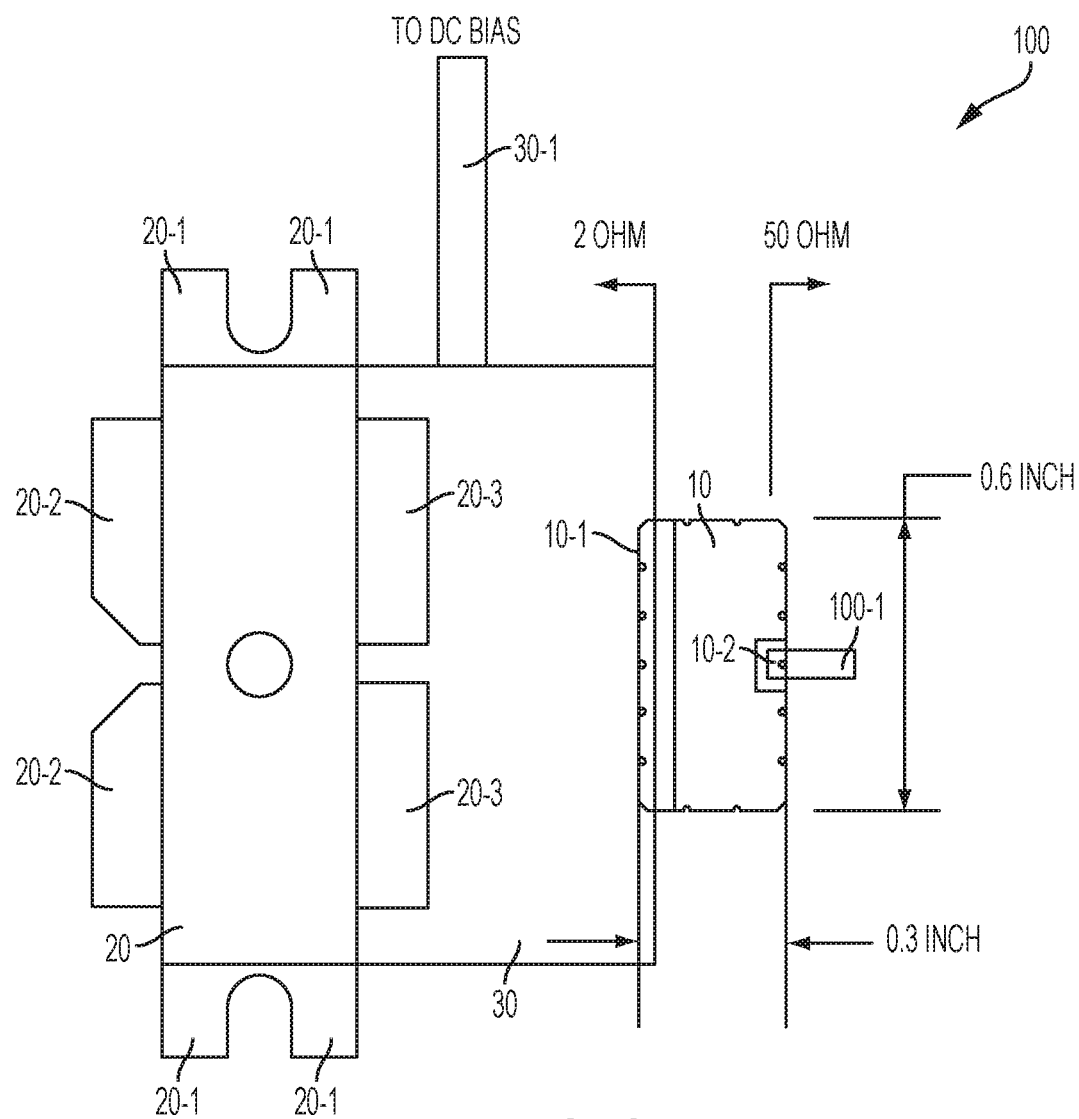
FIG. 8 is a top view of an RF system in accordance with the present invention.

FIG. 8 is a top view of an RF system 100 in accordance with the present invention. The surface mount RF matching component 10 is shown as being coupled to a power amplifier in accordance with the present invention. The power amplifier includes a transistor 20 that has a source 20-1, a gate 20-2, and a drain 20-3. The source 20-1 is again configured as a mounting strap that can be affixed to a ground layer thereunder. The drain 20-3 is coupled to the low impedance (2 Ohm) port 10-1 of device 10. The high impedance (50 Ohm) port 10-2 is coupled to a conductor 100-1 also connected to the load.

Comparing the present invention to the conventional two stage quarter wave transformer approach in FIG. 1, it becomes apparent that the present invention significantly reduces the length of the underlying circuit board from 1.7 inches to 0.3 inches. Note also that the high impedance (50 Ohm) port 10-2 does not require a DC block capacitor.

Figure 9:
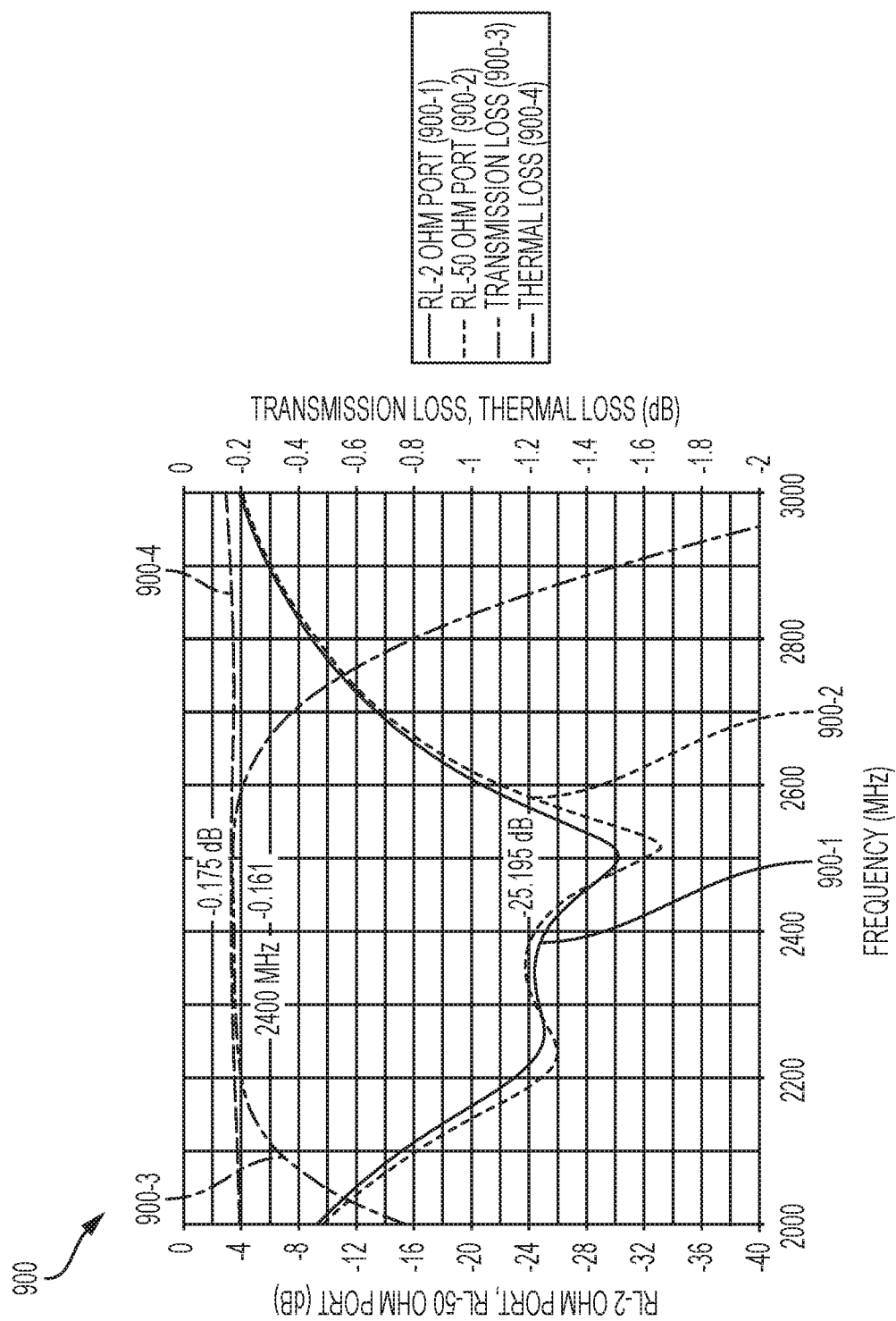
FIG. 9 is a plot illustrating the performance of the surface mount RF matching component in accordance with the present invention.

Referring to FIG. 9, a chart 900 illustrating the performance of the surface mount RF matching component 10 is disclosed. In the frequency band of 2200-2600 MHz, the return loss 900-1 of the low impedance port is substantially at or below −24 dB. The return loss 900-2 of the high impedance port exhibits a similar performance. The transmission loss (i.e., the insertion loss) 900-3 is almost a constant −0.175 dB across the entire band. Moreover, the thermal loss curve is about −0.161 dB from 2000-3000 Mhz. (Note that the lumped-element circuit of FIG. 2 requires inductors and capacitors that have a quality factor (Q) greater than 200).

It should be noted that the thermal energy conducted through a device can be described by the thermal resistance ($R_{th}$); in other words, each element or component (e.g. conductor or dielectric layer) that conducts thermal energy therethrough is characterized by a thermal resistance. Thus, a device can be configured to handle more power is that device or system can reduce the number of thermal resistance elements therein. Moreover, if the device can be adapted to a given RF assembly environment or form factor, superfluous thermal resistance elements can be eliminated.

Figure 10:
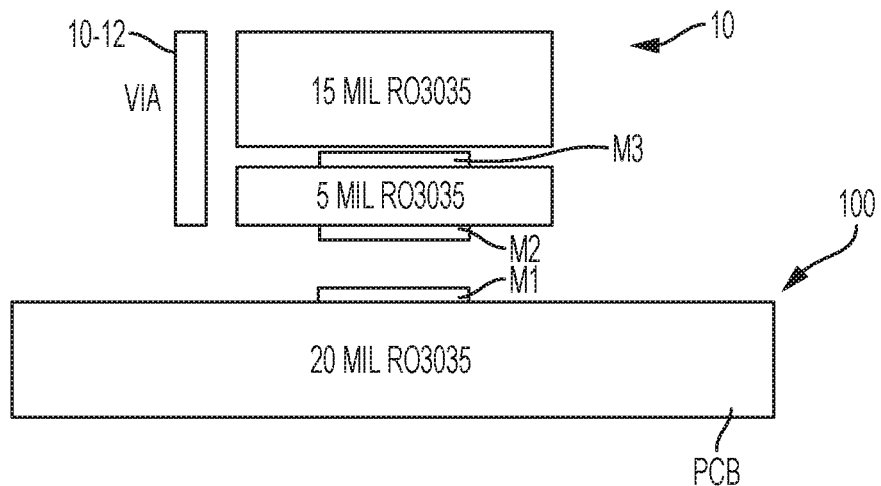
FIG. 10 is a cross-sectional view of an RF system in accordance with another embodiment of the present invention.

Referring to FIG. 10, a cross-sectional view of an RF system in accordance with another embodiment of the present invention is disclosed. In this embodiment, the bottom ground (M1) of all the transmission lines is disposed on the carrier board 100. In this case, the carrier board 100 serves as the bottom dielectric layer. As shown, the device 10 only provides the top two dielectric layers. In this embodiment, the features on M2 are now disposed at the bottom of the component; and, the M3, M4 and via portions are essentially the same as the previous embodiment. Stated differently, the features on the carrier board 100 are essentially the same as the M2 features, providing soldering pads to the component 10. By eliminating the bottom layer of the stripline device 10 (FIGS. 1-8), the thermal path provided by the embodiment of FIG. 10 is much shorter, and hence, the power handling capacity of the device is significantly increased.

Figure 11:
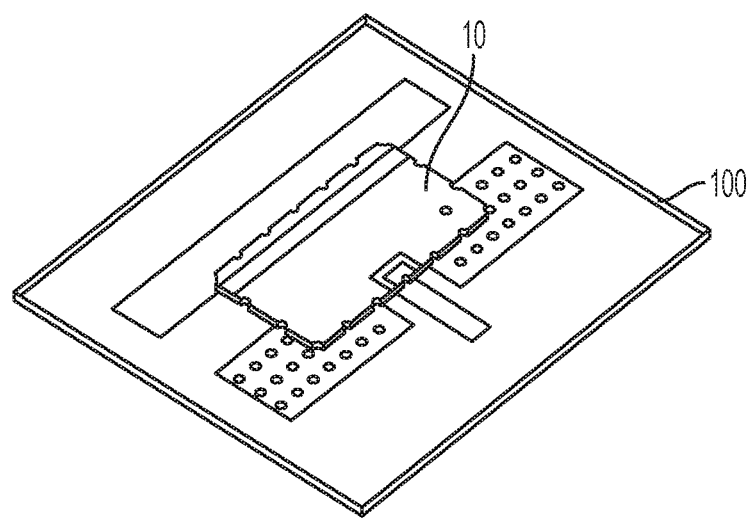
FIG. 11 is an isometric view of the RF system depicted in FIG. 10.

Referring to FIG. 11, an isometric view of the RF system depicted in FIG. 10 is disclosed. In this view, the device 10 is shown as being mounted on the carrier PCB 100. A layer of solder is employed to bond layer M1 (carrier PCB) to layer M2 (device 10).

Figure 12A:
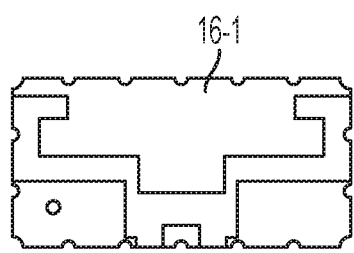
FIGS. 12A-12C are various views of a surface mount RF component in accordance with the embodiment of FIG. 10.
Figure 12B:
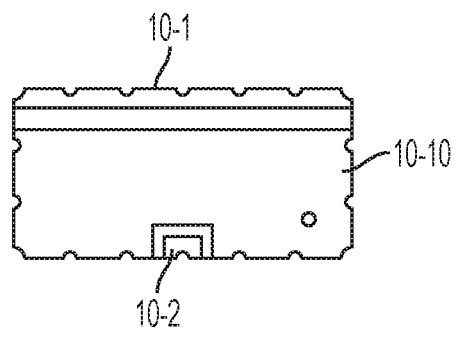
Figure 12C:
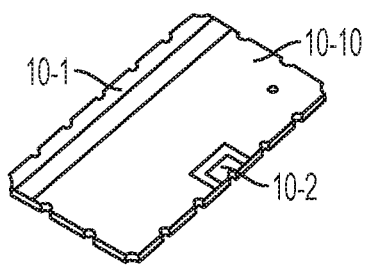
Figure 13:
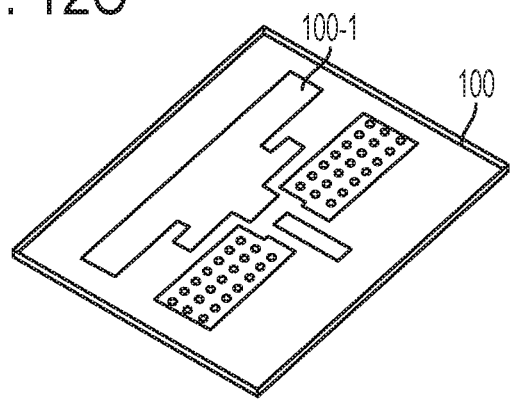
FIG. 13 is an isometric view of a printed circuit board in accordance with the embodiment of FIG. 10.

Referring to FIGS. 12A-12C, various views of a surface mount RF component 10 in accordance with the embodiment of FIG. 10 are disclosed. FIG. 12A shows the bottom M2 layer that is disposed over layer 100-1 (FIG. 13) of the carrier PCB 100. FIG. 12B shows the top layer M4 with metalized low impedance first port 10-1, the second port 10-2 and ground plane 10-10.

Figure 14A:
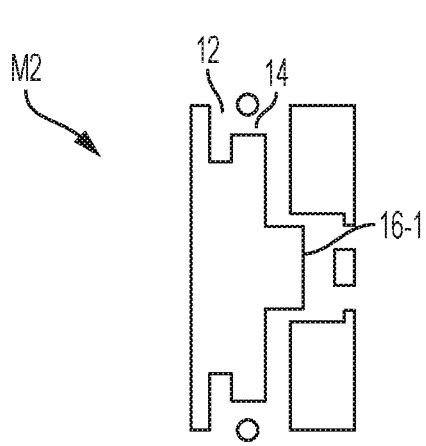
FIGS. 14A-14D are plan views of the various layers of the surface mount RF component depicted in FIG. 12.
Figure 14B:
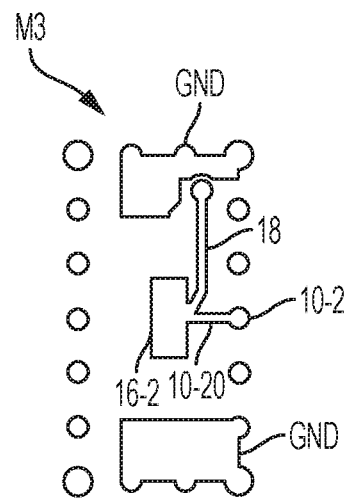
Figure 14C:
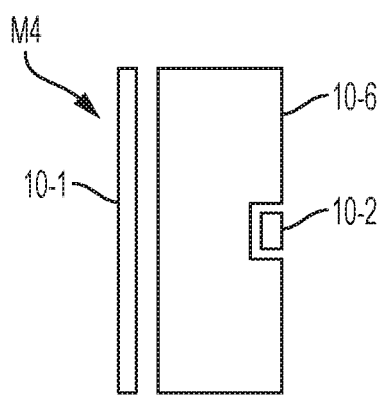
Figure 14D:
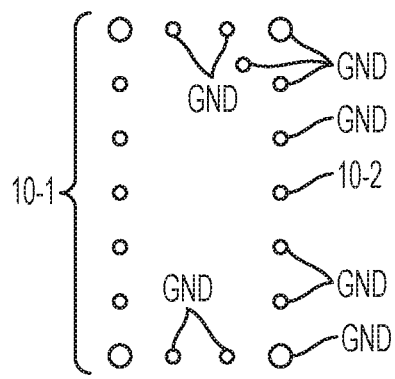

Referring to FIGS. 14A-14D, plan views of the various layers of the surface mount RF component depicted in FIG. 12 are disclosed. FIG. 14A shows layer M2 which includes transmission line 12 (inductor L1), transmission line 14 (shunt capacitor C1) and transmission line 16-1. A portion of via 10-12 is also shown in this view. FIG. 14B includes transmission line 16-2 disposed between two ground plates (GND). As noted above, lines 16-1 and 16-2 are coupled transmission lines (that form capacitor C2). FIG. 14B also includes transmission line 18 (shunt inductor L2). Finally, transmission line 10-20 forms a 50 Ohm transmission line to couples the RF signal to the 50 Ohm port 10-2. FIG. 14C shows the top metallization layer M4 which includes the low impedance (2 Ohm in this case) port 10-1, the high impedance port 10-2 and the ground layer 10-6. In FIG. 14D shows the via structures that are internally disposed in the device 10. As depicted in FIG. 14D, all vias in the left-hand column (in the orientation shown), are tied to 10-1. All of the remaining vias, except 10-2, are ground vias.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An impedance matching device for use at a predetermined frequency, the device comprising:
   a low impedance port having a first impedance substantially equal to an impedance of an RF amplifier port;
   a first distributive transmission line network coupled to the low impedance port, the first distributive transmission line network including a plurality of first transmission lines, each first transmission line being characterized by a first characteristic impedance and a first electric line length less than 45° at the predetermined frequency to form a first quasi-lumped reactive element so that the plurality of first transmission lines form a first quasi-lumped element impedance matching stage;
   at least one second distributive transmission line network coupled to the first distributive transmission line network and a high impedance port, the second distributive transmission line network including a plurality of second transmission lines, each second transmission line being characterized by a second characteristic impedance and a second electric line length less than 45° at the predetermined frequency to form a second quasi-lumped reactive element so that the plurality of second transmission lines form at least one second quasi-lumped element impedance matching stage, wherein the high impedance port is coupled to the at least one second quasi-lumped element impedance matching stage, the high impedance port having a second impedance substantially equal to a system impedance;
   wherein at least one of the plurality of first transmission lines comprises a first coupled line and at least one of the plurality of second transmission lines comprises a second coupled line, wherein a coupler structure comprises the first coupled line and the second coupled line, wherein the low impedance port is coupled to a first end of the first coupled line of the first distributive transmission line while a second opposite end of the first coupled line is left open, and a first end of the second coupled line of the second distributive transmission line network is left open while the high impedance port is coupled to a second opposite end of the second coupled line.

2. The device of claim 1, wherein the impedance matching device includes a first major surface and a second major surface.

3. The device of claim 2, wherein the plurality of first transmission lines or the plurality of second transmission lines are formed by an outer metallization layer disposed on the second major surface, the outer metallization layer being configured to be coupled to a carrier metallization layer formed on a carrier printed circuit board, the outer metallization layer and the carrier metallization layer having substantially similar form factors.

4. The device of claim 2, wherein the first major surface and the second major surface include metalized ground layers.

5. The device of claim 1, wherein the first quasi-lumped element impedance matching stage is selected from a group of networks including a L-type network, a T-type network and a Pi-type network.

6. The device of claim 1, wherein the second quasi-lumped element impedance matching stage is selected from a group of networks including a L-type network, a T-type network and a Pi-type network.

7. The device of claim 1, wherein the first quasi-lumped reactive element is a transmission line that substantially approximates a capacitor or an inductor.

8. The device of claim 1, wherein the second quasi-lumped reactive element is a transmission line that substantially approximates a capacitor or an inductor.

9. The device of claim 1, wherein the plurality of second transmission lines includes a fourth transmission line shunted from an output of the coupler structure to ground.

10. The system of claim 1, wherein at least one of the plurality of first transmission lines is configured to approximate a capacitor and at least one of the plurality of first transmission lines is configured to approximate an inductor.

11. The device of claim 1, wherein the predetermined frequency is a center frequency of a targeted frequency band.

12. An RF system, the system comprising:
   an RF circuit device including a first major surface and a second major surface, the RF circuit device including,
   a low impedance port having a first impedance substantially equal to an impedance of an RF amplifier port,
   a first distributive transmission line network being coupled to the low impedance port, the first distributive transmission line network including a plurality of first transmission lines, each first transmission line being characterized by a first characteristic impedance and a first electric line length less than 45° at the predetermined frequency to form a first quasi-lumped reactive element so that
the plurality of first transmission lines form a first quasi-lumped element impedance matching stage,
   at least one second distributive transmission line network coupled to the first distributive transmission line network and a high impedance port, the second distributive transmission line network including a plurality of second transmission lines, each second transmission line being characterized by a second characteristic impedance and a second electric line length less than 45° at the predetermined frequency to form a second quasi-lumped reactive element so that the plurality of second transmission lines form at least one second quasi-lumped element impedance matching stage, wherein the high impedance port is coupled to the at least one second quasi-lumped element impedance matching stage, the high impedance port having a second impedance substantially equal to a system impedance;
   wherein at least one of the plurality of first transmission lines comprises a first coupled line and at least one of the plurality of second transmission lines comprises a second coupled line, wherein a coupler structure comprises the first coupled line and the second coupled line, wherein the low impedance port is coupled to a first end of the first coupled line of the first distributive transmission line while a second opposite end of the first coupled line is left open, and a first end of the second coupled line of the second distributive transmission line network is left open while the high impedance port is coupled to a second opposite end of the second coupled line; and a printed carrier circuit board (PCB) including at least one RF circuit structure formed thereon, the RF circuit device being coupled to the at least one RF circuit structure.

13. The system of claim 12, wherein the plurality of first transmission lines or the plurality of second transmission lines are formed by an outer metallization layer disposed on the second major surface, the plurality of first transmission lines or the plurality of second transmission lines being configured in accordance with a predetermined shape, the predetermined shape having predetermined dimensions, the predetermined shape and the predetermined dimensions substantially corresponding to a coupling region formed on the printed circuit board.

14. The system of claim 13, wherein the outer metallization layer is configured to be coupled to the coupling region formed on the printed circuit board.

15. The system of claim 13, wherein the first major surface and the second major surface include metalized ground layers.

16. The system of claim 12, wherein the first quasi-lumped element impedance matching stage is selected from a group of networks including a L-type network, a T-type network and a Pi-type network.

17. The system of claim 12, wherein the second quasi-lumped element impedance matching stage is selected from a group of networks including a L-type network, a T-type network and a Pi-type network.

18. The system of claim 12, wherein the first quasi-lumped reactive element is a transmission line that substantially approximates a capacitor or an inductor.

19. The system of claim 12, wherein the second quasi-lumped reactive element is a transmission line that substantially approximates a capacitor or an inductor.

20. The system of claim 12, wherein the plurality of second transmission lines includes a fourth transmission line shunted from an output of the coupler structure to ground.

21. The system of claim 12, wherein at least one of the plurality of first transmission lines is configured to approximate a capacitor and at least one of the plurality of first transmission lines is configured to approximate an inductor.

* * * * *